(12) United States Patent
Ando

(10) Patent No.: US 7,811,931 B2
(45) Date of Patent: Oct. 12, 2010

(54) SEMICONDUCTOR DEVICE HAVING A MODIFIED DIELECTRIC FILM

(75) Inventor: Masateru Ando, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 587 days.

(21) Appl. No.: 11/655,227

(22) Filed: Jan. 19, 2007

(65) Prior Publication Data

US 2007/0181883 A1    Aug. 9, 2007

(30) Foreign Application Priority Data

Jan. 20, 2006    (JP)    ............................. 2006-012566

(51) Int. Cl.
*H01L 21/768*    (2006.01)
(52) U.S. Cl. ............................ 438/640; 438/6; 438/598; 438/622; 438/638; 438/673
(58) Field of Classification Search ..................... None
See application file for complete search history.

(56) References Cited

U.S. PATENT DOCUMENTS 5,482,900 A * 1/1996 Yang ........................... 438/623

FOREIGN PATENT DOCUMENTS

JP    2004-134640    4/2004

* cited by examiner

*Primary Examiner*—Zandra Smith
*Assistant Examiner*—Pamela E Perkins
(74) *Attorney, Agent, or Firm*—Young & Thompson

(57) ABSTRACT

A semiconductor device has a plurality of interconnect layers each including a plurality of interconnect lines. The semiconductor device includes a dielectric film (HDP film) formed by means of high density plasma-enhanced CVD and including an edge formed on the side surface of the topmost-layer interconnect lines, a silicon oxide film formed by modifying a SOG film on the HDP film between adjacent two of the topmost-layer interconnect lines in the element forming region, and a passivation film formed to cover the HDP film and the topmost-layer interconnect lines.

8 Claims, 5 Drawing Sheets

SEMICONDUCTOR DEVICE HAVING A MODIFIED DIELECTRIC FILM

BACKGROUND OF THE INVENTION

1. Field of the Invention

The present invention relates to a semiconductor device having a modified dielectric film and a method of manufacturing the same. More particularly, the present invention relates to a technique suitably applied to a semiconductor device having a laser-cut fuse and a method of manufacturing the same.

2. Description of the Related Art

An aluminum interconnect layer showing a high electric conductivity is used for power supply lines and signal lines formed as upper-layer interconnect lines in a DRAM device, and interconnect lines having a larger thickness have been employed recently from the viewpoint of reducing the access time. Generally, there is a tendency of adding redundant memory cells to DRAM devices for the purpose of accommodating an initial failure of any of the memory cells and a fuse is provided as part of the aluminum interconnect line to control the redundant memory cells. After a device test is completed on the function of the memory cells, some of the fuses are cut by means of a laser beam based on the results of the device test. FIG. 5 of the accompanying drawings schematically illustrates part of the interconnect layers of a known DRAM device.

Referring to FIG. 5, the semiconductor device 50 includes an element forming region 41 and a fuse forming region 42. In the element forming region 41, at least three interlayer dielectric films 12, 18, 25 and interconnect lines 16, 24, 31 of three layers are arranged alternately on a semiconductor substrate 11, and these interconnect lines 16, 24, 31 are connected together by plugs 20, 27. The interconnect lines 16, 24, 31 have a multilayer structure formed by sequentially laying a barrier metal layer 13, 21, 28, a metal layer 14, 22, 29, such as made of aluminum, and an anti-reflection layer 15, 23, 30. Low-electric-resistance interconnect lines are realized by using larger-thickness layers. For example, the interconnect line 31 typically has a thickness of 1.6 μm.

A passivation film 34 that is highly water-resistant is formed on the topmost interconnect line 31 and the interlayer dielectric film 25 to prevent water from entering to inside of the semiconductor device 50 and corroding the interconnect lines 16, 24, 31. A thick organic dielectric film 35 is formed on the passivation film 34 by coating resin and a subsequent heat treatment thereof to protect the semiconductor device 50.

A fuse 17 is formed in the fuse forming region 42. The fuse 17 is typically formed in the layer same as that of the interconnect line 16. In the process of manufacturing the semiconductor device 50, an etching process is conducted to expose the electrode pad of the interconnect line 31 after forming the organic dielectric film 35. In the etching process, the organic dielectric film 35, the passivation film 34, the interlayer dielectric film 25 and an upper part of the interlayer dielectric film 18 overlying the fuse 17 are removed and a fuse-cutting hole 36 is formed to facilitate the step of cutting the fuse 17 by means of a laser beam. The depth of the fuse-cutting hole 36 is so controlled as to allow the thickness $D_1$ of the interlayer dielectric layer 18 remaining on the fuse 17 to have a predetermined value whereby the fuse 17 is assuredly cut.

For instance, JP-2004-134640A describes a semiconductor device having an interconnect layer and a fuse made of aluminum.

Meanwhile, in semiconductor devices such as the semiconductor device 50, a problem of degradation in the water-resistance capability of the passivation film 34 and corrosion of interconnect lines has been and is taking place because of the increased thickness of the topmost-layer interconnect lines 31 including the power supply lines and the signal lines. The problem occurs because, as the thickness of the interconnect line 31 is increased, a large stress arises in the passivation film 34 near the bottom of the interconnect line 31, whereby cracks may easily appear thereat during the heat treatment as indicated by reference numeral 51 shown in FIG. 5. Additionally, the coverage of the passivation film 34 is degraded as the thickness of the interconnect line 31 increases to aggravate the problem. As the water-resistance capability of the passivation film 34 is degraded, moisture may penetrate into the internal of the passivation film 34 in an anti-moisture test or the like.

The above problem may be solved by increasing the thickness of the passivation film 34. However, in semiconductor devices having a fuse to be cut by means of a laser beam, the total thickness of the dielectric films 18, 25, 34 that are formed to overlie the fuse 17 tends to have a larger range of variation as the thickness of the passivation film 34 is increased. Ten, the thickness $D_1$ of the interlayer dielectric film 18 that is left on the fuse 17 after the etching process may have a larger range of variation. Thus, some of the fuses of such semiconductor devices may be left uncut. The range of variation of the thickness $D_1$ may be reduced by reducing the etching rate for forming the fuse-cutting hole 36. However, this inevitably reduces the throughput of the process for manufacturing semiconductor devices.

SUMMARY OF THE INVENTION

Therefore, there is a strong demand for a method of manufacturing semiconductor devices that can effectively reduce the step difference attributable to the thickness of the interconnect line 31 of the topmost interconnect layer, while suppressing the increase of the thickness of the dielectric films on the fuse 17, to prevent a defective cutting from taking place on the fuse 17 and at the same time to suppress the possible corrosion of the interconnect lines.

In view of the problem and the demand as described above, it is therefore an object of the present invention to provide a semiconductor device and a method of manufacturing a semiconductor device that can suppress the increase of the thickness of the dielectric films formed on the fuse, and at the same time, effectively reduce the step difference attributable to the presence of the topmost interconnect layer.

The present invention provides a semiconductor device including: a multilayer interconnection structure overlying a substrate, the multilayer interconnection structure including a plurality of topmost-layer interconnect lines and at least one another-layer interconnect lines underlying the topmost-layer interconnect lines; a dielectric film formed using a high-density plasma-enhanced chemical vapor deposition (HDP-CVD) process and having an edge in contact with a sidewall of the topmost-layer interconnect lines; a silicon oxide film covering the dielectric film in a space between adjacent two of the interconnect lines and formed by modifying a spin-on-glass (SOG) film; and a passivation film formed on the silicon oxide film and the topmost-layer interconnect lines.

The present invention also provides a method for manufacturing a semiconductor device including the steps of: forming a multilayer interconnection structure including a plurality of dielectric layers and a plurality of interconnect layers each including a plurality of interconnect lines; forming a dielectric film by using a high-density plasma-enhanced chemical vapor deposition (DP-CVD) process, the dielectric film having an edge in contact with a sidewall of the interconnect lines of a topmost interconnect layer among the plurality of interconnect layers; forming a silicon oxide film on the dielectric film, the silicon oxide film having an edge in contact with the sidewall of the interconnect lines of the topmost interconnect layer; etching the silicon oxide film to leave a portion of the silicon oxide film in a space between adjacent two of the interconnect lines of the topmost interconnect layers; and forming a passivation film covering the etched silicon oxide film and the topmost-layer interconnect layer.

In accordance with the semiconductor device of the present invention and the semiconductor device manufactured by the method of the present invention, the dielectric film (HDP-CVD film), which is formed using a HDP-CVD process before the step of forming the silicon oxide film such as obtained by modifying the SOG film, reduces the step difference of the silicon oxide film caused by the presence of the topmost-layer interconnect lines while suppressing increase of the thickness of the dielectric films, especially at the portion overlying the fuse, if the fuse is provided as the common layer with the another-layer interconnection lines.

The silicon oxide film, if it is obtained by modifying a thick SOG film in a heat treatment without providing the HDP-CVD film as an underlying film on the topmost-layer interconnect lines, may have an unmodified portion or an insufficiently modified portion in the vicinity of the bottom of the topmost-layer interconnect lines. The unmodified portion or insufficiently modified portion is likely to absorb water to corrode the underlying interconnect lines. It is known that the factors causing the unmodified or insufficiently modified portion include a smaller taper angle formed between the sidewall of the topmost-layer interconnect lines and the vertical surface.

In the method of the present invention, the underlying dielectric film formed using the HDP-CVD process, before forming the silicon oxide film, and having the edge in contact with the sidewall of the topmost-layer interconnect lines, increases the corner angle of the silicon oxide film between the bottom surface of the flat part of the silicon oxide film and the bottom surface of the rising part of the silicon oxide film rising on the sidewall of the topmost-layer interconnect lines, compared to the case where the underlying dielectric film is not formed. The larger corner angle allows the portion of the SOG film in the vicinity of the bottom of the topmost-layer interconnect lines to be sufficiently modified, and alleviates the stress applied to the topmost-layer interconnect lines in a later heat treatment.

DETAILED DESCRIPTION OF THE PREFERRED EMBODIMENTS

Figure 1:
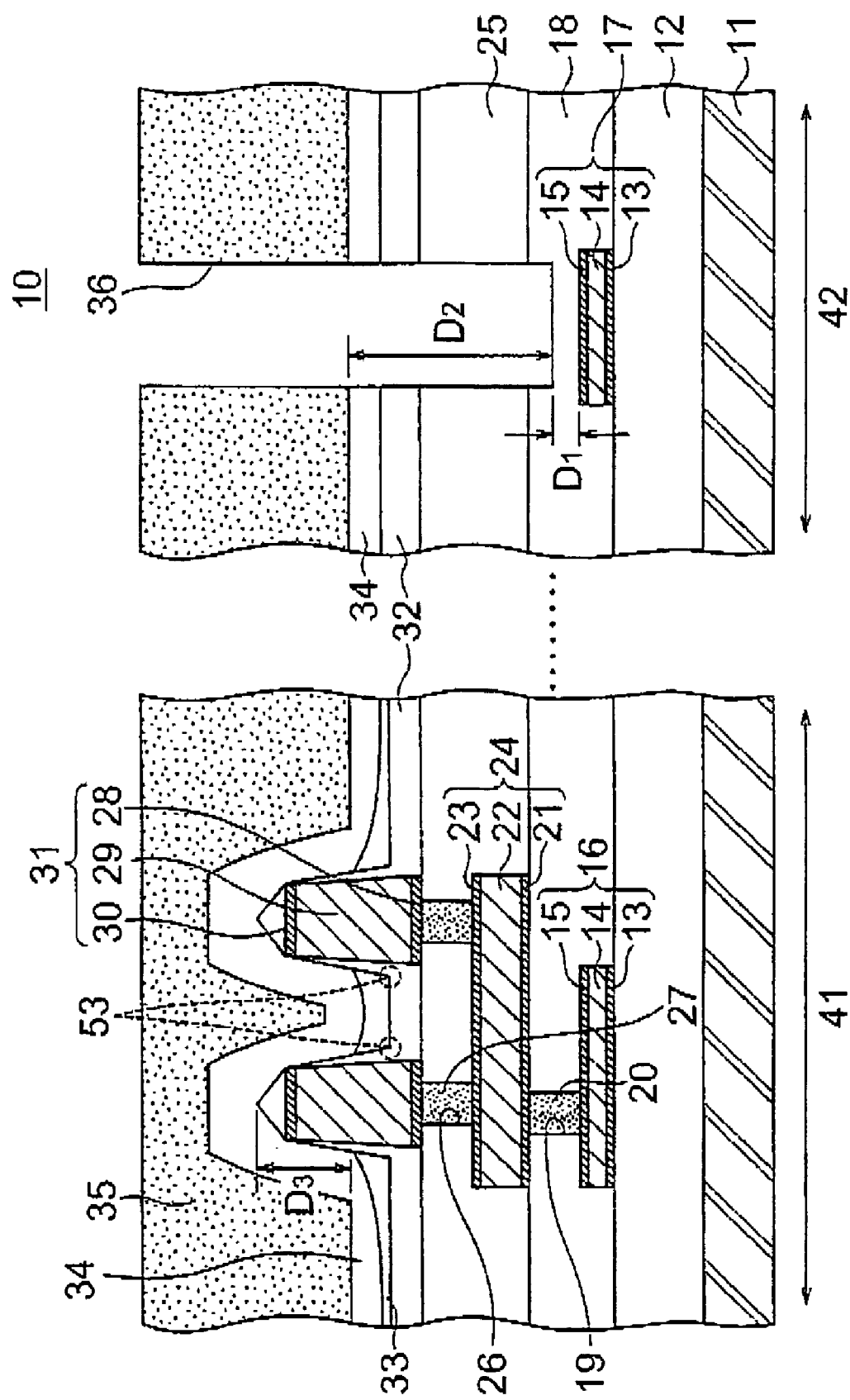
FIG. 1 is a schematic sectional view of an embodiment of a semiconductor device according to the present invention, illustrating the configuration thereof.

Now, the present invention will be described in more detail with reference to the accompanying drawings that schematically illustrate preferred embodiments of the invention. FIG. 1 is a schematic sectional view of a semiconductor device according to an embodiment of the present invention, illustrating the structure thereof. Referring to FIG. 1, the semiconductor device 10 is configured as a DRAM device having redundant additional memory cells. FIG. 1 has an element forming region 41 where a memory cell is formed and a fuse forming region 42 where a fuse to be cut by means of a laser beam is formed to control the redundant memory cell, illustrating the respective configurations thereof.

The semiconductor device 10 includes a semiconductor substrate 11 made of p-type silicon and an interlayer dielectric film 12 formed on the semiconductor substrate 11. The interlayer dielectric film 12 is typically an $SiO_2$ film, a TEOS (tetraethylorthosilicate) film or a BPSG (borophosphosilicate glass) film, and has a thickness of about 4,300 nm to 4,800 nm. The interlayer dielectric films 12, 18, 25 are formed for the purpose of isolating the word lines and the bit lines that overlie the semiconductor substrate 11 from each other. The interlevel dielectric films typically include three or more than three layers of dielectric film.

A first-layer interconnect line 16 and a fuse 17 are respectively formed in the element forming region 41 and the fuse forming region 42 on the interlayer dielectric film 12. The first-layer interconnect line 16 and the fuse 17 are formed to have predetermined respective patterns, and each of them includes a barrier metal layer 13, a metal layer 14 and an anti-reflection layer 15 that are deposited sequentially one on another. The barrier metal layer 13 includes an about 20-nm-thick. Ti layer (not shown) and an about 30-nm-thick TiN layer (not shown), while each of the metal layer 14 and the anti-reflection layer 15 includes an about 270-nm-thick aluminum layer and an about 50-nm-thick TiN film.

An interlayer dielectric film 18 that is about 900 nm thick is formed to cover the interlayer dielectric film 12, the first-layer interconnect line 16 and the fuse 17. The distance between the top surface of the interlayer dielectric film 18 and the top surface of the first-layer interconnect line 16 is about 600 nm. A first through-hole 19 is formed to penetrate the interlayer dielectric film 18 to reach the first-layer interconnect line 16, and a first plug 20 is formed to fill the internal of the first through-hole 19. The first plug 20 includes an about 50-nm-thick TiN layer (not shown) formed on the surface of the internal of the first through-hole 19, and a blanket tungsten (not shown) filled in the internal of the first through-hole 19 by way of the TiN layer.

A second-layer interconnect line 24 is formed in the element forming region 41 and connected to the first plug 20 on the interlayer dielectric film 18. The second-layer interconnect line 24 has a predetermined pattern, and includes a barrier metal layer 21, a metal layer 22 and an anti-reflection layer 23 that are deposited sequentially one on another. The barrier metal layer 21 includes an about 20-nm-thick Ti layer (not shown) and an about 30-nm-thick TiN layer (not shown), wherein each of the metal layer 22 and the anti-reflection layer 23 includes an about 600-nm-thick aluminum layer and an about 25-nm-thick TiN film.

An interlayer dielectric film 25 is formed to cover the interlayer dielectric film 18 and the second-layer interconnect line 24. A second through-hole 26 is formed to penetrate the interlayer dielectric film 25 and reach the second-layer interconnect line 24, and a second plug 27 is formed to fill the internal of the second through-hole 26. The second plug 27 includes an about 50-nm-thick TiN layer (not shown) formed on the surface of the internal of the second through-hole 26 and a blanket tungsten (not shown) filled in the internal of the second through-hole 26 by way of the TiN layer.

A third-layer interconnect line 31, which is the topmost-layer interconnect, is formed in the element forming region 41 and connected to the second plug 27. The third-layer interconnect line 31 has a predetermined pattern, and includes a barrier metal layer 28, a metal layer 29 and an anti-reflection layer 30 that are deposited sequentially one on another. The barrier metal layer 28 includes an about 20-nm-thick Ti layer (not shown) and an about 30-nm-thick TiN layer (not shown), while each of the metal layer 29 and the anti-reflection layer 30 includes an about 1.6-μm-thick aluminum layer and an about 25-nm-thick TiN film. The side surfaces of the first-layer interconnect line 16, the second-layer interconnect line 24 and the third-layer interconnect line 31 are substantially perpendicular to the top surface of the semiconductor substrate 11 or the top surface of the interlayer dielectric films 12, 18, 25, and thus have a small taper angle. The term "taper angle" as used in this text means the angle between the specified surface and the vertical surface or a perpendicular to the substrate surface.

An about 300-nm-thick dielectric film (HDP film) 32 is formed on the surface of the interlayer dielectric film 25 and the side surface and the top surface of the third-layer interconnect line 31 by means of high density plasma-enhanced chemical vapor deposition (HDP-CVD). An HDP film has a feature that it is formed on a sidewall with a large taper angle. Thus, the HDP film 32 typically has a taper angle of around 45° on the side surface of the third-layer interconnect line 31. The part of the HDP film 32 that is formed on the third-layer interconnect line 31 has a thickness smaller than that of the remaining part of the HDP film 32 and has a triangular cross section due to etch back thereof.

A silicon oxide film 33 that is formed by modifying a spin-on-glass (SOG) film is formed on the HDP film 32 in the element forming region 41. In the element forming region 41, the silicon oxide film 33 has a thickness that is increased in regions where the pattern of the third-layer interconnect line 31 is densely formed and where the third-layer interconnect line 31 is closely located. In the fuse forming region 42, the silicon oxide film 33 is formed with a smaller thickness and removed as a result of etching back. The silicon oxide film 33 is about 300 nm thick near the third-layer interconnect line 31 where the thickness is largest. Thus, the height of the step difference formed by the third-layer interconnect line 31 and hence the distance $D_3$ between the top end of the HDP film 32 formed on the third-layer interconnect line 31 and the top surface of the silicon oxide film 33 formed beside the side surface of the third-layer interconnect line 31 is about 1.1 to 1.2 μm.

An about 500-nm-thick passivation film (cover film) 34 is formed to cover the silicon oxide film 33 and the HDP film 32. Then, an organic dielectric film 35 that is made of polyimide is formed to substantially cover the entire surface of the passivation film 34. The top surface of the organic dielectric film 35 is made substantially flat.

The passivation film 34, the HDP film 32 and the anti-reflection film 30 are removed to expose the metal layer 29 in part of the element forming region 41. The exposed part of the metal layer 29 functions as a bonding pad used for assembly of the semiconductor device. The organic dielectric film 35, the passivation film 34, the HDP film 32, the interlayer dielectric film 25 and an upper part of the interlayer dielectric film 18 are removed from above the fuse 17 in the fuse forming region 42 to produce a fuse cutting hold 36. The thickness $D_1$ of the interlayer dielectric film 18 remaining on the fuse 17 is so selected that the cutting step may be conducted successfully by means of a laser beam.

In the semiconductor device 10 of the present embodiment, an HDP film 32 is arranged between the third-layer interconnect line 31 and the silicon oxide film 33. The HDP film 32 has a feature that it is formed on the sidewall of the top-layer interconnect lines with a larger taper angle. It is to be noted that the angle between the side surface of the HDP film 32 formed on the sidewall of the third-layer interconnect line 31 and the surface of the HDP film 32 that is in parallel with the surface of the underlying interlayer dielectric film 25 is greater than the angle between the side surface of the third-layer interconnect line 31 and the surface of the underlying interlayer dielectric film 25. This fact means that the HDP film increases the corner angle of the silicon oxide film 33 between the bottom surface of the flat part of the silicon oxide film 33 and the bottom surface of the rising part of the silicon oxide film 33. As a result, it is possible to suppress the phenomenon that the bottom corner 53 of the silicon oxide film 33 formed in the vicinity of the bottom of the third-layer interconnect line 31 is insufficiently modified, so as to absorb moisture to a large extent due to its nature.

The silicon oxide film 33 has a small thickness and then etched back for removal in the fuse forming region 42, and to have a large thickness near the third-layer interconnect line 31. As a result, it is possible to suppress the increase of the thickness of the dielectric films on the fuse 17 and at the same time to reduce the step difference formed by the third-layer interconnect line 31.

Figure 2:
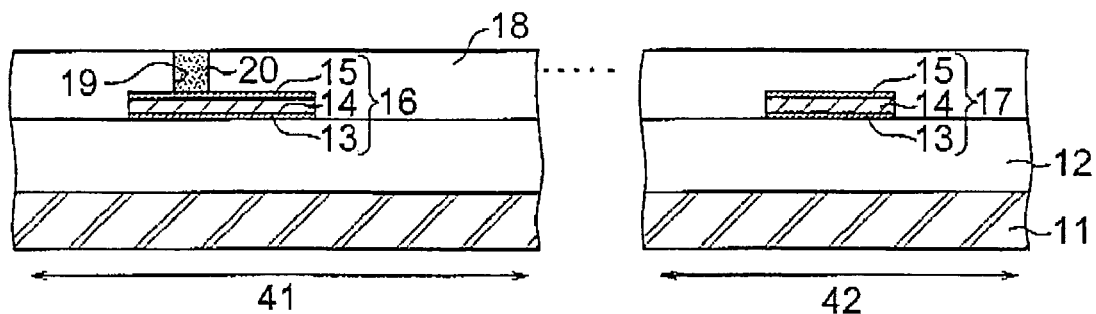
FIG. 2 is a schematic sectional view of the semiconductor device of FIG. 1 in a manufacturing step thereof.
Figure 3:
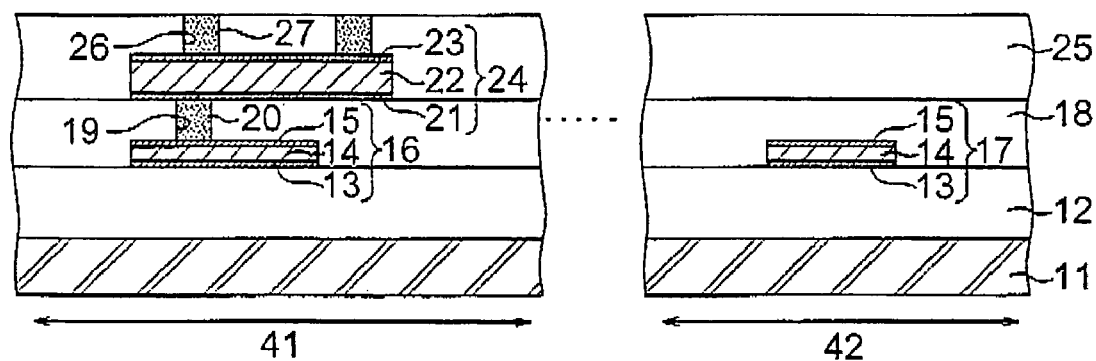
FIG. 3 is a schematic sectional view of the semiconductor device of FIG. 1 in a manufacturing step subsequent to that of FIG. 2.
Figure 4:
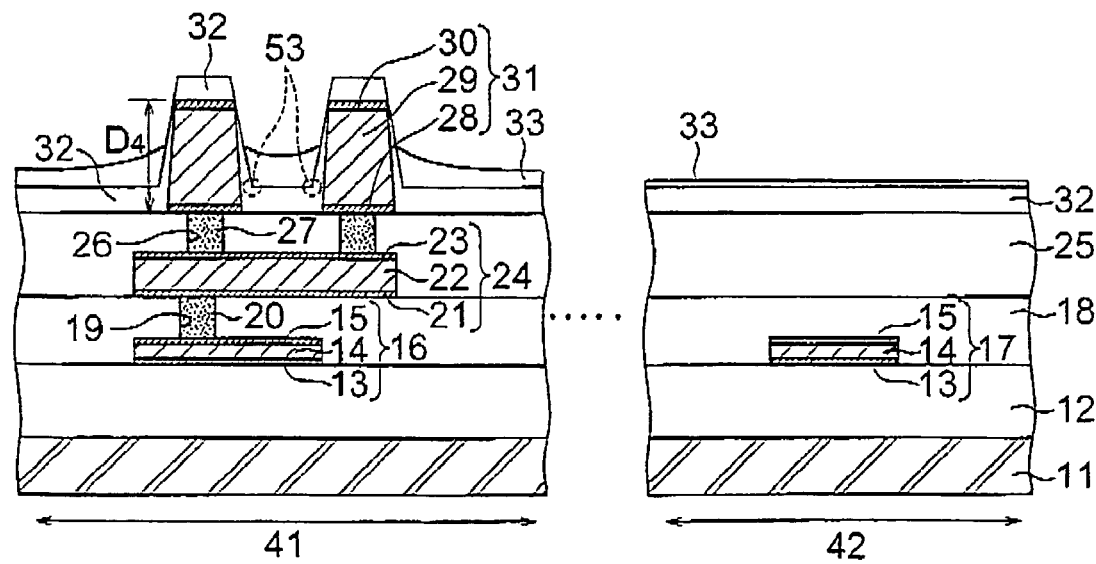
FIG. 4 is a schematic sectional view of the semiconductor device of FIG. 1 in a manufacturing step subsequent to that of FIG. 3.
Figure 5:
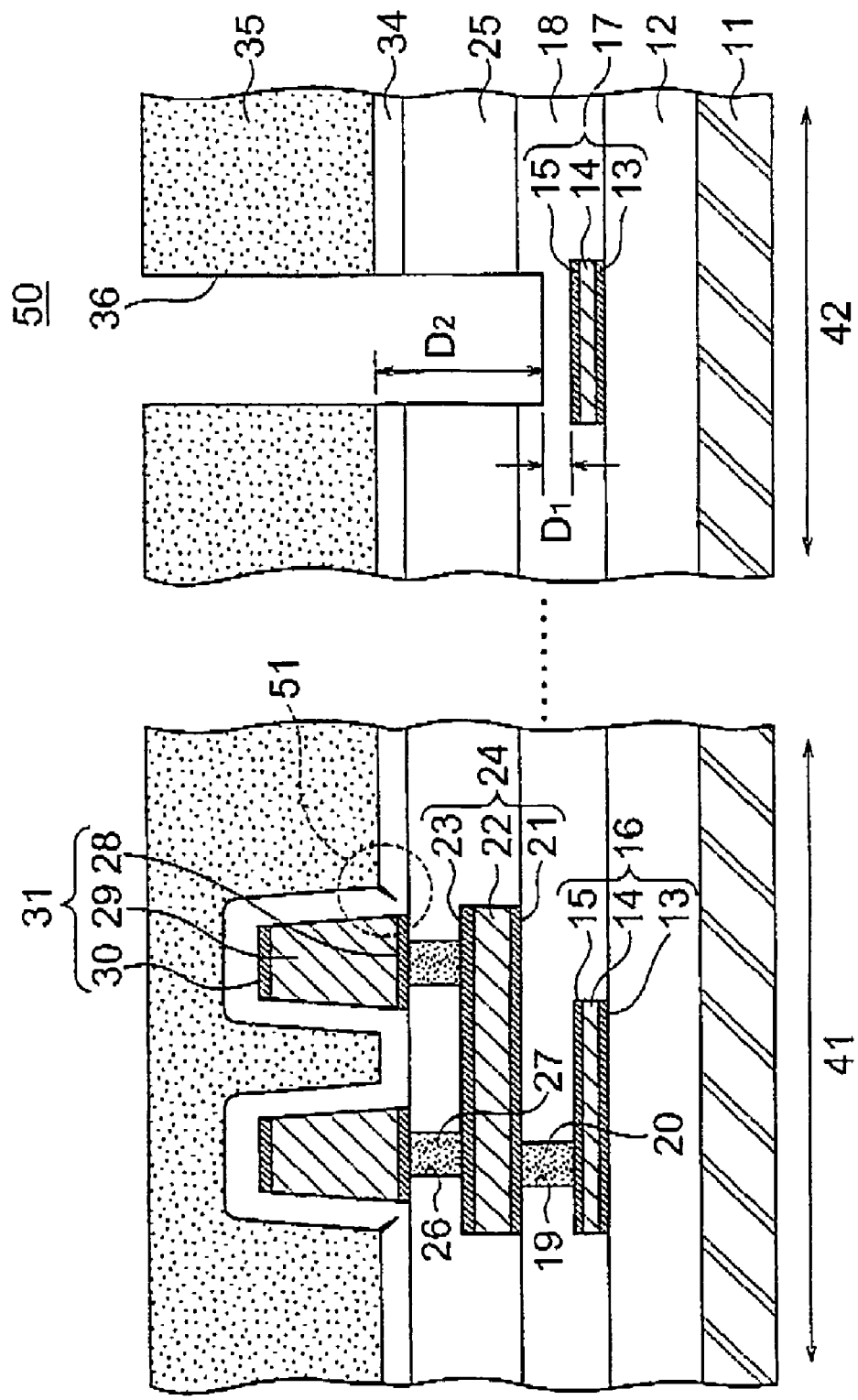
FIG. 5 is a schematic sectional view of a conventional semiconductor device in a manufacturing step thereof.

FIGS. 2 through 4 are schematic sectional views of the semiconductor device 10 in consecutive manufacturing steps. Firstly, an interlayer dielectric film 12 is formed on the semiconductor substrate 11 that is made of p-type silicon. Then, a barrier metal layer 13, a metal layer 14 and an anti-reflection layer 15 are formed sequentially thereon to produce an interconnect-layer structure thereon. Subsequently, the interconnect-layer structure is subjected to a patterning step, using known photolithographic and etching techniques to produce a first-layer interconnect line 16 and a fuse 17 in the element forming region 41 and the fuse forming region 42, respectively.

Thereafter, a dielectric film is formed to a thickness of about 1 μm by means of an HDP-CVD process. It is possible to reliably bury the adjacent interconnect lines by forming a dielectric film by means of an HDP-CVD process. Then, the surface of the dielectric film is polished using a CMP (chemical mechanical polishing) process. Then, an interlayer dielectric film 18 is produced by forming an about 300-nm-thick $SiO_2$ film on the dielectric film by means of plasma-enhanced CVD or the like.

Subsequently, a first through-hole 19 that runs through the interlayer dielectric film 18 and reach the first-layer interconnect line 16 is formed by means of known photolithographic and etching techniques. An about 50-nm-thick TiN layer and an about 300-nm-thick blanket tungsten layer are formed sequentially on the entire surface including the internal of the first through-hole 19, and thereafter the TiN layer and the blanket tungsten layer deposited on the interlayer dielectric film 18 are removed by a CMP process. As a result, a first plug 20 is produced in the internal of the first through-hole 19 (FIG. 2).

Then, an interconnect-layer structure is formed by sequentially forming a barrier metal layer 21, a metal layer 22 and an anti-reflection layer 23. Subsequently, the interconnect-layer structure is subjected to a patterning step by means of known photolithographic and etching techniques to produce a second-layer interconnect line 24 in the element forming region 41. A dielectric film is formed to a thickness of about 1.4 μm by means of an HDP-CVD process and then the surface of the dielectric film is polished by a CMP process as in the case of the interlayer dielectric film 18. Then, an about 300-nm-thick $SiO_2$ film is formed on the dielectric film by means of plasma-enhanced CVD to produce an interlayer dielectric film 25.

Subsequently, a second through-hole 26 that runs through the interlayer dielectric film 25 to reach the second-layer interconnect line 24 is formed by means of known photolithographic and etching techniques. An about 50-nm-thick TiN layer and an about 300-nm-thick blanket tungsten layer are formed sequentially on the entire surface including the internal of the second through-hole 26, and thereafter the TiN layer and the blanket tungsten layer deposited on the interlayer dielectric film 25 are removed by a CMP process. As a result, a second plug 27 is produced in the internal of the second through-hole 26 (FIG. 3). The TiN layers and the blanket tungsten layers deposited on the interlayer dielectric films 18, 25 may alternatively be removed by etch back thereof by means of an anisotropic dry etching process.

Thereafter, a barrier metal layer 28, a metal layer 29 and an anti-reflection layer 30 are formed sequentially to produce an interconnect-layer structure. Subsequently, the interconnect-layer structure is subjected to a patterning step, using known photolithographic and etching techniques, to produce a third-layer interconnect line 31 in the element forming region 41. The step difference formed by the third-layer interconnect line 31, or the distance $D_4$ between the top surface of the third-layer interconnect line 31 and the top surface of the interlayer dielectric film 25 is about 1.6 μm in this manufacturing step.

Then, an HDP film 32 is formed to a thickness of about 300 nm by means of an HDP-CVD process. The HDP film 32 has a large taper angle at the sidewall of the third-layer interconnect line 31. Thus, the angle formed between the surface of the HDP film 32 on the sidewall of the third-layer interconnect line 31 and the surface of the HDP film 32 that runs in parallel with the interlayer dielectric film 25 is larger than the angle formed between the side surface of the third-layer interconnect line 31 and the surface of the interlayer dielectric film 25.

Subsequently, an about 400-nm-thick SOG film is formed by coating the entire surface of the wafer. Then, the SOG film is heat-treated (baked) at 400° C. for about 10 minutes for the purpose of modifying the SOG film and changes the same into a silicon oxide film. Since the angle formed between the surface of the HDP film at the sidewall of the third-layer interconnect line 31 and the surface of the HDP film 32 that runs in parallel with the interlayer dielectric film 25 is sufficiently large, the SOG film is modified sufficiently near the bottom of the third-layer interconnect line 31, as indicated by reference numeral 53.

Additionally, the SOG film produced by coating generally has a large thickness in the region where the interconnect pattern is dense and also in the region near the interconnect during the heat treatment. In other words, the silicon oxide film 33 formed from the modified SOG film is thick near the third-layer interconnect line 31 and thin on the fuse 17 where no third-layer interconnect line 31 is formed. The silicon oxide film 33 has a thickness of about 400 nm near the third-layer interconnect line 31 and about 100 nm on the fuse 17.

Subsequently, the silicon oxide film 33 is etched back to such an extent that the silicon oxide film 33 formed in the fuse forming region 42 is completely removed by an anisotropic etching process. The thickness of the HDP film 32 is reduced by the anisotropic etching on the third-layer interconnect line 31 as compared with the other area and the HDP film 32 has a triangular cross section. The step difference produced by the third-layer interconnect line 31, or the distance $D_3$ between the top surface of HDP film 32 formed on the third-layer interconnect line 31 and top section of the silicon oxide film 33 formed on the sidewall of the third-layer interconnect line 31 is reduced down to about 1.1 to 1.2 μm in this manufacturing step. Only the HDP film 32 is left on the interlayer dielectric film 25 in the fuse forming region 42.

Thereafter, an about 500-nm-thick passivation film 34 is formed on the entire surface by means of plasma-enhanced CVD. SiON or SiN is typically used for the passivation film 34. Then, an organic dielectric film 35 of polyimide is formed on the entire surface by coating, and subjected to a heat treatment for thermally setting. The heat treatment process is conducted typically at 320° C. in a nitrogen atmosphere, in which the organic fluorescence film 35 is maintained for 30 minutes.

Subsequently, the third-layer interconnect line 31 is selectively exposed to configure a bonding pad (not shown) by removing the organic dielectric film 35, the passivation film 34, the HDP film 32 and the anti-reflection layer 30 in part of the element forming region 41 by using known photolithographic and etching techniques. At this step, a fuse-cutting hole 36 is formed in the fuse forming region 42 by etching while adjusting the etching depth $D_2$ so as to allow the thickness $D_1$ of the dielectric film left on the fuse 17 to have a predetermined value. As a result, the semiconductor device 10 as shown in FIG. 1 is completed.

In the method of manufacturing a semiconductor device of the present embodiment, the HDP film 32 is formed before forming the silicon oxide film 33. It is to be noted that, by the function of the HDP film 32 which is formed on the sidewall of the topmost-layer interconnect lines 31 with a large taper angle, the angle formed between the surface of the rising part of the HDP film 32 and the surface of the flat part of the HDP film 32 that is in parallel with the surface of the underlying interlayer dielectric film 25 is larger than the angle formed between the side surface of the third-layer interconnect line 31 and the surface of the underlying interlayer dielectric film 25. Thus, it can be said that the HDP film increases the corner angle of the bottom corner 53 of the SOG film 33 compared to the case where the HDP film 32 is not formed. As a result, it is possible to sufficiently modify the SOG film 33 at the bottom corner, as indicated by reference numeral 53, located in the vicinity of the bottom of the third-layer interconnect line 31.

The silicon oxide film 33, which is configured by the modified SOG film, has a larger thickness in the regions where the patterns of the third-layer interconnect line 31 age more densely arranged and where the third-layer interconnect line 31 is more closely located thereto. Thus, it is possible to effectively reduce the step difference produced by the third-layer interconnect line 31, while suppressing an increase of the thickness of the part of the dielectric film on the fuse 17 where the third-layer interconnect line 31 is not formed. Additionally, it is possible to remove the silicon oxide film 33 on the fuse 17, leaving a relatively thick silicon oxide film 33 near the third-layer interconnect line 31, by etching back the silicon oxide film 33 to such an extent that the silicon oxide film 33 formed in the fuse forming region 42 is completely removed.

As a result of conducting the above-described manufacturing process, it is possible to effectively reduce the step difference formed by the third-layer interconnect line 31, while suppressing the increase of the thickness of the dielectric films on the fuse 17. Thus, it is possible to improve the coverage of the passivation film that covers the third-layer interconnect line 31 and at the same time to suppress generation of cracks in the passivation film 34 and suppress corrosion of the interconnect. Furthermore, it is possible to reduce the range of variation of the thickness D1 of the interlayer dielectric film 18 left on the fuse 17 to suppress any defective cutting of the fuse 17.

In the above described embodiment, the steps of forming a silicon oxide film 33 and etch back thereof may be repeatedly conducted after etching back the silicon oxide film 33 as shown in FIG. 4. In such an arrangement, it is possible to further deposit a silicon oxide film 33 near the third-layer interconnect line 31 to effectively reduce the step difference formed by the third-layer interconnect line 31.

The fuse 17 is exemplarily formed in the layer same as that of the first-layer interconnect line 16 in the above embodiment. However, the present invention is equally applicable to an arrangement where the fuse is formed in the layer same as that of the second-layer interconnect line 24.

Figure 6:
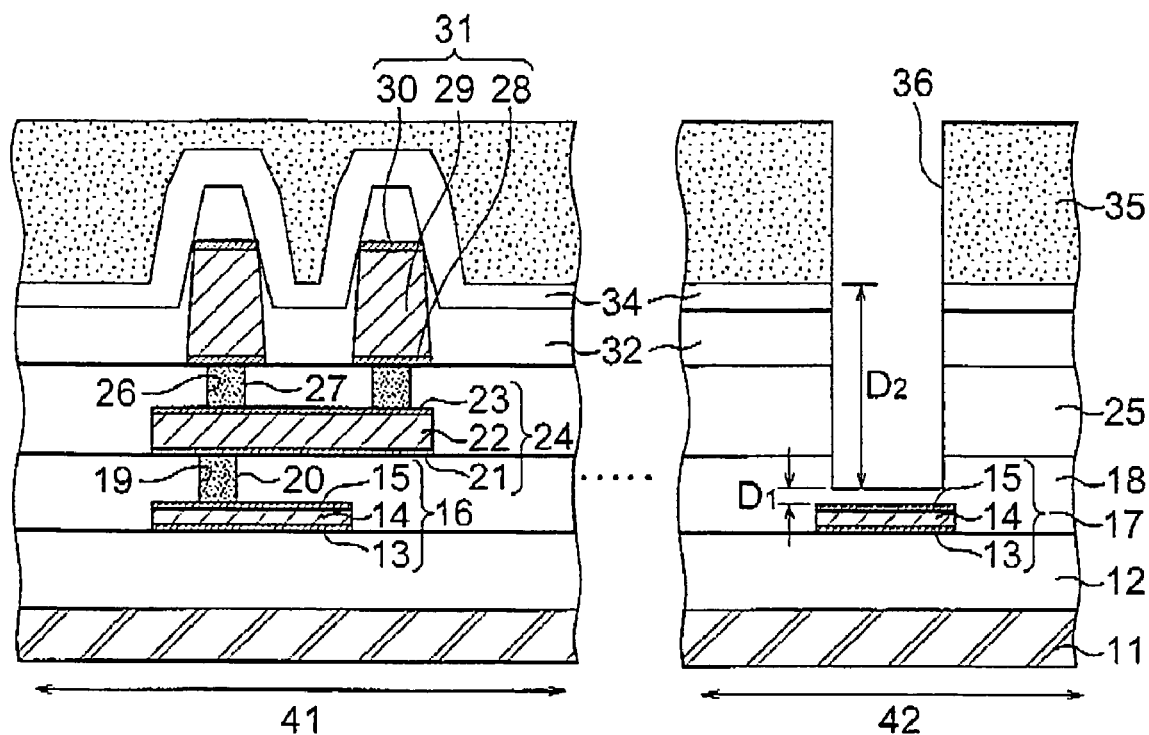
FIG. 6 is a schematic sectional view of a semiconductor device in a manufacturing step thereof, which is manufactured as comparative example 1.

FIG. 6 is a schematic sectional view of a semiconductor device in a manufacturing step thereof, which is manufactured as comparative example 1. In this comparative example, no silicon oxide film 33 is formed as a modified SOG film and hence etching back such a film is not conducted. For compensating the absence of the silicon oxide film 33 in this comparative example, it is necessary to form a HDP film 32 having a thickness much greater than the thickness of the HDP film 32 of the above embodiment, for the purpose of satisfactorily preventing cracks from being produced in the passivation film 34.

However, the larger thickness of the HDP film 32 increases the thickness of the dielectric film formed on the fuse 17, thereby increasing the range of variation in the thickness $D_1$ of the interlayer dielectric film 18 remaining on the fuse 17. As a result, some of the fuses 17 may not be cut. Although this problem may be avoided by reducing the etching rate in the etching step for forming the fuse-cutting hole 36, the throughput will inevitably be reduced by the reduction of the etching rate. Additionally, in this manufacturing method, the thickness of the HDP film 32 formed on the third-layer interconnect line 31 is increased to increase the amount of etching during forming the bonding pad, which is to be used for assembly of the semiconductor device. As a result of the increased thickness of the HDP film 32 formed on the third-layer interconnect line 31, there arises a problem that the organic dielectric film 35 formed to protect the semiconductor device 10 has an excessively smaller remaining thickness.

Contrary to the above-described comparative example, in the method of manufacturing a semiconductor device of the present embodiment, the thickness of the HDP film 32 is reduced by the thickness of the silicon oxide film 33 formed in the space between the interconnect lines of the topmost layer, as a result of etching the silicon oxide film 33. Additionally, it is possible to further suppress any increase of the thickness of the dielectric film on the fuse 17 by removing the silicon oxide film 33 formed on the fuse 17. Furthermore, it is possible to secure a sufficient thickness for the organic dielectric film 35 because the thickness of the HDP film 32 formed on the third-layer interconnect line 31 is reduced.

Figure 7:
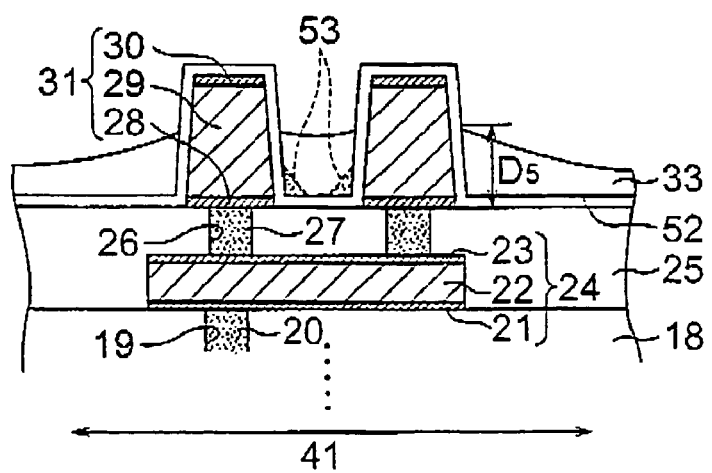
FIG. 7 is a schematic sectional view of another semiconductor device in a manufacturing step thereof, which is manufactured as comparative example 2.

FIG. 7 is a schematic sectional view of another semiconductor device in a manufacturing step thereof, which is manufactured as comparative example 2. This comparative example differs from the above-described embodiment in that no HDP film 32 is formed and the silicon oxide film 33 is formed by modifying the SOG film, after forming a thin barrier layer 52 from silicon oxide film to cover the interconnect line 31 of the topmost layer for the purpose of preventing penetration of the solvent of the SOG film. The barrier layer 52 is formed typically to a thickness of about 100 nm. The absence of the HDP film 32 in this comparative example necessitates the thickness of the silicon oxide film 33 to be much greater compared to that in the above embodiment in order to satisfactorily prevent cracks from being produced in the passivation film 34. For instance, the largest thickness $D_5$ of the silicon oxide film 33 may have to be as large as 800 nm after the heat treatment.

However, as the thickness of the silicon oxide film 33 increases, there arises a problem that the SOG film may not be modified sufficiently near the bottom of the third-layer interconnect line 31 as indicated by reference numeral 53 in FIG. 7. An SOG film that is not modified in a sufficient degree is likely to absorb moisture to a large extent so that there arises a risk of corrosion on the third-layer interconnect line 31 because a large stress arises in the barrier layer 52 to give rise to cracks there during the heat treatment for modifying the SOG film and the subsequent heat treatment (baking process) conducted on the organic dielectric film 35. Contrary to this comparative example, in the method of manufacturing a semiconductor device of the present embodiment, the HDP film 32 formed before forming the silicon oxide film 33 provides a suitably larger bottom corner angle for the silicon oxide film 33, as described before. Thus, it is possible to satisfactorily modify the SOG film near the bottom of the third-layer interconnect line 31 as indicated by reference numeral 53 and alleviate the stress that arises in the subsequent heat treatment step.

Figure 8:
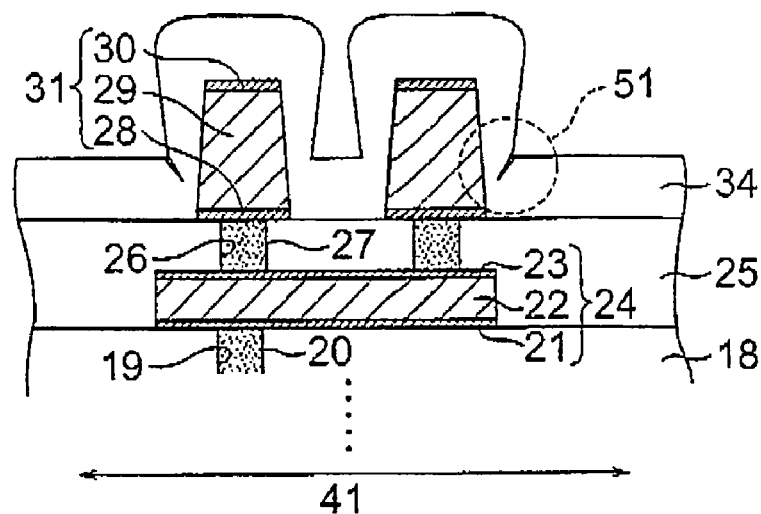
FIG. 8 is a schematic sectional view of another semiconductor device in a manufacturing step thereof, which is manufactured as comparative example 3.

FIG. 8 is a schematic sectional view of another semiconductor device in a manufacturing step thereof, which is manufactured as comparative example 3. Unlike the manufacturing method of the above embodiment, neither the HDP film 32 nor the silicon oxide film 33 formed by modifying a SOG film are provided in this comparative example, and hence there are not any such films to be etched back. Thus, the passivation film 34 having a larger thickness is provided therein. However, in this comparative example, the thickness $D_1$ of the dielectric film 18 left on the fuse 17 has a large range of variation and hence some of the fuse 17 may not be cut because of the thick passivation film 34. Additionally, the coverage of the passivation film 34 may be degraded and cracks may be produced near the bottom of the third-layer interconnect line 31 as indicated by reference numeral 51 in FIG. 8. Furthermore, there arises a problem that the parasitic capacitance between adjacent third-layer interconnect lines 31 due to the passivation film 34. For these reasons, the inventor of the present invention believes that the method of manufacturing a semiconductor device according to this comparative example 3 is not suited.

Figure 9:
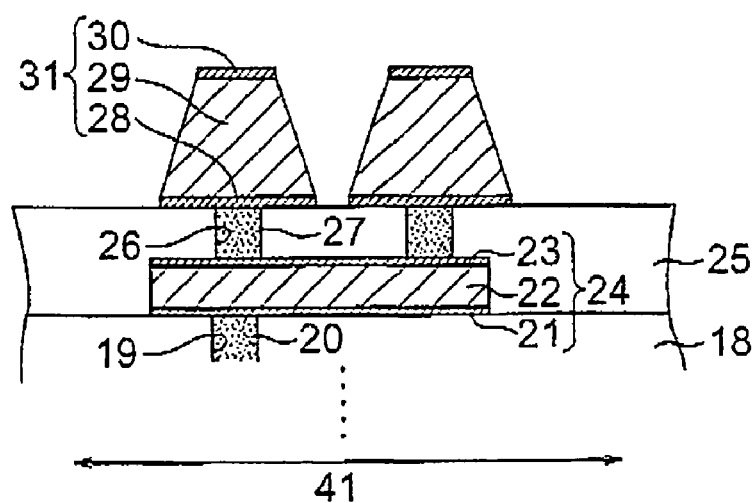
FIG. 9 is a schematic sectional view of another semiconductor device in a manufacturing step thereof, which is manufactured as comparative example 4.

FIG. 9 is a schematic sectional view of another semiconductor device in a manufacturing step thereof, which is manufactured as comparative example 4. Unlike the manufacturing method of the above-described embodiment, neither the HDP film 32 nor the silicon oxide film 33 formed by modifying a SOG film are provided in this comparative example, and hence there are not any such films to be etched back. Additionally, the side surface of the third-layer interconnect line 31 has a large taper angle. It is known that a interconnect having a large taper angle may be formed typically by adjusting the bias power being applied to the electrode to reduce the selectivity ratio relative to the resist film in the etching step for patterning the aluminum layer that is formed on the entire surface of the interlayer dielectric film 25 so as to cause carbon that is the principle ingredient contained in the resist film to adhere to the side surface of the aluminum layer. It is also known that a interconnect having a large taper angle may also be formed by adding gas such as $CHF_3$ and/or $CH_4$ in the etching process using gas such as $Cl2/BCl_3$ and causing a carbon-based deposit to adhere to the side surface of the aluminum layer.

However, although the coverage of the passivation film 34 is improved by forming a third-layer interconnect line 31 having the side surface that has a large taper angle, the anti-corrosion margin is considerably reduced and a short-circuit failure may arise between adjacent third-layer interconnect lines 31 as the trend of reduction in the design rule. For these reasons, the inventor of the present invention believes that the method of manufacturing a semiconductor device of this comparative example 4 is not suited.

In the present invention, it is preferable that the dielectric film include silicon oxide. It is also preferable that the passivation film include SiON and/or SiN. It is also preferable that the fuse and the interconnect lines include aluminum. It is not necessary that the edge of the silicon oxide film exposes therefrom the edge of the HDP-CVD film.

While the present invention is described as above by way of a preferable embodiment, the semiconductor device and the method of manufacturing such a semiconductor device of the present invention are not limited to the above-described embodiment, which may be modified and/or altered in various different ways without departing from the spirit and scope of the present invention. For example, while the above-described embodiment is a DRAM device, the present invention is also applicable to other semiconductor devices.

What is claimed is:

1. A semiconductor device comprising:
    a multilayer interconnection structure overlying a substrate, said multilayer interconnection structure including a plurality of topmost-layer interconnect lines and at least one another-layer interconnect lines underlying said topmost-layer interconnect lines;
    a dielectric film having an edge in contact with a sidewall of said topmost-layer interconnect lines, the edge tapering to zero thickness on said sidewall at an angle different than a corresponding angle of said sidewall;
    a silicon oxide film covering said dielectric film in a space between adjacent two of said interconnect lines, wherein a combined thickness of said silicon oxide film and said dielectric film is less than a corresponding height of said topmost-layer interconnect lines; and
    a passivation film formed on said silicon oxide film and said topmost-layer interconnect lines.

2. The semiconductor device according to claim 1, wherein said dielectric film includes silicon oxide.

3. The semiconductor device according to claim 1, further comprising an organic dielectric film covering said passivation film.

4. The semiconductor device according to claim 3, wherein said organic dielectric film includes polyimide.

5. The semiconductor device according to claim 1, wherein said passivation film includes SiON and/or SiN.

6. The semiconductor device according to claim 1, further comprising a fuse formed as a common layer with said another-layer interconnect lines, wherein a portion of said silicon oxide film overlying said fuse is removed.

7. The semiconductor device according to claim 6, wherein said fuse includes aluminum.

8. The semiconductor device according to claim 1, wherein said at least one interconnect layer of said multilayer interconnection structure includes aluminum.

* * * * *